United States Patent
Lee et al.

(10) Patent No.: US 8,604,851 B2
(45) Date of Patent: Dec. 10, 2013

(54) DIGITAL PHASE LOCKED LOOP DEVICE AND METHOD IN WIRELESS COMMUNICATION SYSTEM

(75) Inventors: Kang-Yoon Lee, Seoul (KR); Young-Gun Pu, Seoul (KR); An-Soo Park, Seoul (KR); Joon-Sung Park, Seoul (KR); Jae-Sup Lee, Yongin-si (KR)

(73) Assignees: Samsung Electronics Co., Ltd., Suwon-si (KR); Konkuk University Industrial Cooperation Corp, Seoul (KR)

( * ) Notice: Subject to any disclaimer, the term of this patent is extended or adjusted under 35 U.S.C. 154(b) by 0 days.

(21) Appl. No.: 13/817,816

(22) PCT Filed: Aug. 19, 2011

(86) PCT No.: PCT/KR2011/006115
§ 371 (c)(1),
(2), (4) Date: Feb. 19, 2013

(87) PCT Pub. No.: WO2012/023826
PCT Pub. Date: Feb. 23, 2012

(65) Prior Publication Data
US 2013/0147531 A1    Jun. 13, 2013

(30) Foreign Application Priority Data
Aug. 19, 2010 (KR) .......... 10-2010-0080080

(51) Int. Cl.
*H03L 7/06* (2006.01)
(52) U.S. Cl.
USPC .......... 327/158; 327/149

(58) Field of Classification Search
USPC .......... 327/149, 158
See application file for complete search history.

(56) References Cited

U.S. PATENT DOCUMENTS

2008/0315928 A1* 12/2008 Waheed et al. .......... 327/159
2008/0315960 A1* 12/2008 Waheed et al. .......... 331/17

(Continued)

FOREIGN PATENT DOCUMENTS

| JP | 2008-537425 | 9/2008 |
|---|---|---|
| JP | 2010028457 | 2/2010 |
| JP | 2010-098704 | 4/2010 |
| KR | 10-2010-0062888 | 6/2010 |

OTHER PUBLICATIONS

International Search Report dated Feb. 6, 2012 in connection with International Patent Application No. PCT/KR2011/006115.
Written Opinion dated Feb. 6, 2012 in connection with International Patent Application No. PCT/KR2011/006115.

(Continued)

*Primary Examiner* — Adam Houston

(57) ABSTRACT

A digital Phase Locked Loop (PLL) in a wireless communication system is provided. The PLL includes a Digitally Controlled Oscillator (DCO), a divider, a Phase Frequency Detector (PFD), a Time to Digital Converter (TDC), a delay comparator, and a level scaler. The DCO generates a frequency signal depending on an input Digital Tuning Word (DTW). The divider divides the frequency signal at an integer ratio. The PFD generates a signal representing a phase difference between a divided frequency signal and a reference signal. The TDC measures a time interval of the phase difference using the signal representing the phase difference. The delay comparator calculates a time interval in the case where rising edges coincide from values measured by the TDC. The level scaler generates a DTW that operates the DCO using a digital code representing the time interval.

20 Claims, 11 Drawing Sheets

(56) References Cited

U.S. PATENT DOCUMENTS

| | | | |
|---|---|---|---|
| 2010/0195779 A1* | 8/2010 | Sai | 375/376 |
| 2011/0204944 A1* | 8/2011 | Lee et al. | 327/159 |
| 2012/0049912 A1* | 3/2012 | Yoshida et al. | 327/156 |
| 2012/0176169 A1* | 7/2012 | Sinha et al. | 327/156 |
| 2012/0201338 A1* | 8/2012 | Leung et al. | 375/376 |
| 2013/0147531 A1* | 6/2013 | Lee et al. | 327/158 |

OTHER PUBLICATIONS

Robert Bogdan Staszewski et al.: "Phase-Domain All-Digital Phase-Locked Loop", IEEE Transactions on Circuits and Systems—Express Briefs, vol. 52, No. 3, Mar. 2005, pp. 159-163.

Minjae Lee, et al.: "A Low-Noise Wideband Digital Phase-Locked Loop Based on a Course-Fine Time-to-Digital Converter With Subpicosecond Resolution", IEEE Journal of Solid-State Circuits, vol. 44, No. 10, Oct. 2009, pp. 2808-2816.

* cited by examiner

DIGITAL PHASE LOCKED LOOP DEVICE AND METHOD IN WIRELESS COMMUNICATION SYSTEM

CROSS-REFERENCE TO RELATED APPLICATION(S)

The present application claims priority under 35 U.S.C. §365 to International Patent Application No. PCT/KR2011/006115 filed Aug. 19, 2011, entitled "DIGITAL PHASE LOCKED LOOP DEVICE AND METHOD IN WIRELESS COMMUNICATION SYSTEM". International Patent Application No. PCT/KR2011/006115 claims priority under 35 U.S.C. §365 and/or 35 U.S.C. §119(a) to Korean Patent Application No. 10-2010-0080080 filed Aug. 19, 2010, and which are incorporated herein by reference into the present disclosure as if fully set forth herein.

BACKGROUND OF THE INVENTION

1. Field of the Invention

The present invention relates to a wireless communication system. More particularly, the present invention relates to a Phase Locked Loop (PLL) digitally implemented in a wireless communication system.

2. Description of the Related Art

A PLL is widely used to generate a carrier of an application in a 4-th Generation (4G) system such as a Long Term Evolution (LTE), a cellular phone such as Bluetooth, a Global Positioning System (GPS), a Wideband Code Division Multiple Access (WCDMA), and a wireless Local Area Network (LAN) such as 802.11a/b/g.

In the conventional analog PLL, since a divider should operate in high speed and includes a current source and cannot use a Width-to-Length (W/L) ratio of Metal Oxide Semiconductor (MOS) minimally depending on a noise and accuracy issue, an area cannot reduce remarkably when a process is scaled down. Since a loop filter includes a passive resistor and a capacitor, it requires a wide area. Also, since an analog signal level is important, a plurality of buffers such as a Voltage-Controlled Oscillator (VCO) buffer, a Local Oscillator (LO) buffer, an Output buffer, etc. are used, so that current consumption becomes very large. Furthermore, since an analog PLL is sensitive to a process characteristic, almost all blocks should be redesigned when a process changes or is scaled down, so that much time is taken in manufacturing and manufacturing costs increase. Also, as a fractional PLL is used due to a problem of a channel interval of a Radio Frequency (RF) band and a PLL bandwidth, a sigma-delta modulator is used to implement a divider of a fractional ratio. Accordingly, a divider circuit is complicated and power consumption and an area increase.

SUMMARY OF THE INVENTION

To address the above-discussed deficiencies of the prior art, it is a primary aspect of the present invention to provide an apparatus and a method for resolving power and area problems of a PLL in a wireless communication system.

Another aspect of the present invention is to provide an apparatus and a method for implementing a digital PLL showing high performance at low power and a small area in a wireless communication system.

In accordance with an aspect of the present invention, an apparatus of a digital Phase Locked Loop (PLL) in a wireless communication system is provided. The apparatus includes a Digitally Controlled Oscillator (DCO) for generating a frequency signal depending on an input Digital Tuning Word (DTW), a divider for dividing the frequency signal at an integer ratio, a Phase Frequency Detector (PFD) for generating a signal representing a phase difference between a divided frequency signal and a reference signal, a Time to Digital Converter (TDC) for measuring a time interval of the phase difference using the signal representing the phase difference, a delay comparator for calculating a time interval when rising edges coincide from values measured by the TDC, and a level scaler for generating a DTW that operates the DCO using a digital code representing the time interval.

A digital PLL according to the present invention may reduce an area occupied by the PLL and power consumption. Accordingly, a high performance digital PLL may be applied to a small sized communication apparatus such as a portable terminal as well as the general communication apparatus.

Other aspects, advantages and salient features of the invention will become apparent to those skilled in the art from the following detailed description, which, taken in conjunction with the annexed drawings, discloses exemplary embodiments of the invention.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

Throughout the drawings, like reference numerals will be understood to refer to like parts, components and structures.

DETAILED DESCRIPTION OF EXEMPLARY EMBODIMENTS

FIGS. 1 through 11, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communications system Hereinafter, a preferred embodiment of the present invention is described in detail with reference to the accompanying drawings. Also, descriptions of well-known functions and constructions are omitted for clarity and conciseness.

Figure 1:
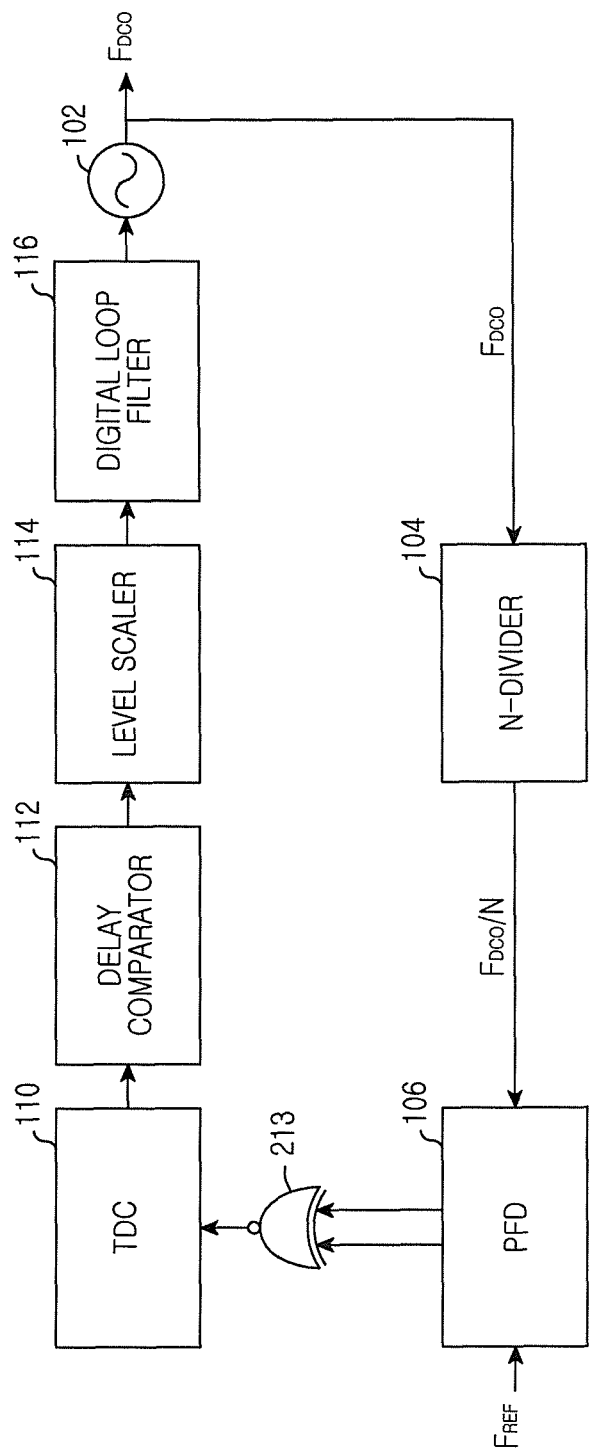
FIG. 1 is a block diagram illustrating a digital PLL according to an embodiment of the present invention.

FIG. 1 is a block diagram illustrating a digital PLL according to an embodiment of the present invention.

As illustrated in FIG. 1, the digital PLL includes a Digitally Controlled Oscillator (DCO) 102, an N-divider 104, a Phase Frequency Detector (PFD) 106, an eXclusive OR (XOR) operator 108, a Time to Digital Converter (TDC) 110, a delay comparator 112, a level scaler 114, and a digital loop filter 116.

The DCO 102 receives a Digital Tuning Word (DTW) from the digital loop filter 116, and generates a signal of a frequency corresponding to the DTW. At this point, the DCO 102 controls an output frequency by controlling at least one of inductance and capacitance depending on the DTW. For example, a basic output frequency $F_{DCO}$ of the DCO may be 2.4 GHz. The basic output frequency may change depending on a characteristic and a standard of a system. For convenience in description, the present invention assumes that $F_{DCO}$ is 2.4 GHz.

The N-divider 104 divides a frequency signal output from the DCO 102 using an integer ratio. For example, in the case where the basic output frequency $F_{DCO}$ of the DCO is 2.4 GHz and a dividing ratio is 64, the divider converts the frequency to 37.5 MHz ($=F_{DCO}/64$) by dividing $F_{DCO}$ of 2.4 GHz by 64. For example, the N-divider 104 may include a plurality of flip-flops connected in series. In this case, each of the plurality of flip-flops divides an input frequency signal doubly.

The PFD 106 receives a signal divided by the N-divider 104 and a reference frequency $F_{REF}$, compares phases of the $F_{DCO}/N$ and $F_{REF}$, and outputs an up signal and a down signal. The up signal denotes a signal representing a relevant phase difference in the case where $F_{REF}$ has a higher frequency than $F_{DCO}/64$, and the down signal denotes a signal representing a relevant phase difference in the case where $F_{REF}$ has a lower frequency than $F_{DCO}/64$. Here, the phase difference denotes a time difference between clock periods of respective signals. An example of an output of the PFD 106 is illustrated in FIG. 2.

Figure 2:
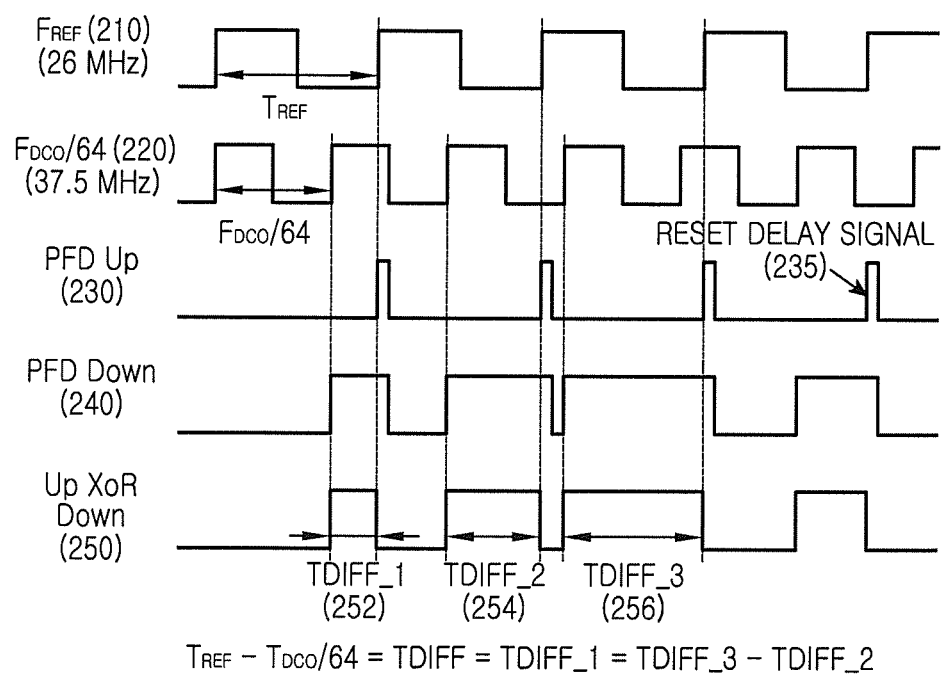
FIG. 2 is a view illustrating an output waveform of a Phase Frequency Detector (PFD) in a digital PLL according to an embodiment of the present invention.

FIG. 2 illustrates an output waveform of a PFD 106 in a digital PLL according to an embodiment of the present invention. In FIG. 2, the present invention assumes that $F_{REF}$ 210 is 26 MHz, $F_{DCO}$ is 2.4 GHz, and N is 64. $F_{DCO}/64$ 220 of 37.5 MHz and $F_{REF}$ 210 are compared by the PFD 106, and then an up signal and a down signal representing a difference between the two signals are output. At this point, since $F_{REF}$ 210 has a lower frequency than $F_{DCO}/64$ 220, a reset delay signal 235 of the PFD 106 is output as an up signal 230, and a signal summing a signal representing a phase difference between $F_{REF}$ 210 and $F_{DCO}/64$ 220 and the reset delay signal 235 is output as a down signal 240. The reset delay signal 235 is a control signal for resetting the up signal 230 and the down signal 240, and is periodically generated in accordance with the period of $F_{REF}$ 210. That is, the reset delay signal 235 is for an operation of the PFD 106, and does not directly represent a comparison result of two input signals 210 and 220.

The XOR operator 108 performs an XOP operation on an up signal and a down signal output from the PFD 106. The up signal and the down signal output from the PFD 106 include a reset delay signal not representing information. Therefore, the XOR operator 108 obtains only an accurate difference between $F_{REF}$ and $F_{DCO}/64$ by XOR-operating the up signal and the down signal including the reset delay signal and removing the reset delay signal. Referring to FIG. 2, an up XOR down signal 250 is generated by the XOR operator 108.

The TDC 110 converts a time difference value represented in an input XOR-operated up signal and down signal to a digital code. At this point, to obtain a wide input range and a high resolution output, the TDC 110 uses time amplifying and phase interpolation. A detailed construction of the TDC 110 is described with reference to FIGS. 3 to 7.

The delay comparator 112 compares two successive digital codes provided from the TDC 110 and outputs a difference value of the comparison result. That is, to obtain a difference value when rising edges coincide, the delay comparator 112 calculates a difference between a k-th digital code and a (k-1)-th digital code provided from the TDC 110. A principle in which the difference value at the state of coinciding rising edges is obtained is described below.

Referring to FIG. 2, a period $T_{REF}$ of $F_{REF}$ 210 which is 26 MHz is 38.46 ns, and a period $T_{DCD}/64$ of $F_{DCO}/64$ 220 which is 37.5 MHz is 26.67 ns. Therefore, a phase difference $T_{diff}(=T_{REF}-T_{DCD}/64)$ between the two signals is 11.79 ns. Ideally, $T_{diff}$ is $T_{diff\_1}$ 252 obtained by XOR-operating an up signal 230 and a down signal 240 of the PFD 106 at a state of coinciding rising edges of $F_{REF}$ 210 and $F_{DCO}/64$ 220. However, since the rising edges of $F_{REF}$ 210 and $F_{DCO}/64$ 220 do not coincide generally, in this case, a difference between $T_{diff\_3}$ 256 obtained by XOR-operating an up signal and a down signal of third waveforms of $F_{REF}$ 210 and $F_{DCO}/64$ 220, and $T_{diff\_2}$ 254 obtained by XOR-operating an up signal and a down signal of second waveforms of $F_{REF}$ 210 and $F_{DCO}/64$ 220 is determined as $T_{diff\_1}$ 252. Relation between $T_{diff\_1}$ 252, $T_{diff\_2}$ 254, and $T_{diff\_3}$ 256 is expressed by Equation (1) below.

$$T_{DIFF} = \frac{1}{F_{REF}} \frac{1}{F_{DCO}/64} = T_{DIFF}1 = (T_{DIFF}3) - (T_{DIFF}2) \qquad (1)$$

In equation (1), $T_{DIFF}$ is a time interval in case of coinciding rising edges, $F_{REF}$ is a reference signal frequency, and $F_{DCO}$ is an output frequency of the DCO 102.

In the case where the rising edges do not coincide, a phase difference value is measured large as much as the mismatching rising edges. Therefore, when generalized, a subtraction result between two successively measured phase difference values becomes a phase difference at a state of coinciding rising edges.

A fractional part of the conventional analog PLL is not required due to the construction of the TDC 110 and the delay comparator 112. Accordingly, the fractional divider used by the conventional analog PLL may be excluded, and the N-divider 104 of a simpler and efficient construction having an integer dividing value may be used.

The level scaler 114 adds Channel Control Words (CCW) such that a digital code provided from the delay comparator 112 becomes a digital tuning word corresponding to an oscillation frequency of the DCO 102, and adds codes for channel switching depending on channel selection information. Specifically, the level scaler 114 subtracts two successive digital codes provided from the delay comparator 112, and adds at least one of a CCW and the channel switching code to the subtraction result. Here, the CCW denotes a digital tuning word corresponding to a basic output frequency of the DCO 102. In other words, the level scaler 114 generates a digital tuning word for operating the DCO 102. In addition, in case of having to change an output frequency of the DCO 102 to change a channel for communication, the level scaler 114 changes a digital tuning word to a value corresponding to a value of an output frequency of a relevant channel by adding a channel switching code to the digital tuning word. Therefore, when a channel does not change, the level scaler 114 adds only the CCW Also, the level scaler 114 performs scaling suitable for an input range of the DCO 102 by multiplying the digital tuning word by a Level Scale Word (LSW).

The digital loop filter 116 reduces an error occur rate by removing a noise of a digital tuning word provided from the level scaler 114. At this point, the digital loop filter 116 may divide the digital tuning word, provide a coarse portion, that is, a Most Significant Bits (MSB), to the DCO 102 as a DCO coarse tuning code, and provide a fine portion, that is, a Least Significant Bits (LSB), to the DCO 102 as a DCO fine tuning code.

As described with reference to FIG. 1, a time difference value of a signal obtained by XOR-operating an up signal and a down signal generated by the RFD 106 is measured by the TDC 110 and then output as a digital code. That is, since the TDC 110 should measure a time difference corresponding to a difference between a reference frequency $F_{REF}$ and a divided DCO output frequency $F_{DCO}/N$, an input range of the TDC 110 should be determined to correspond to a tuning range of the DCO 102. In the following description, the present invention assumes that N is 64.

Table 1 illustrates a magnitude of a down signal of the PFD 106 depending on a tuning range of the DCO 102. Here, the magnitude of the down signal denotes a pulse width of the down signal.

TABLE 1

| Tuning Range | | $F_{DCO}$ | $F_{DCO}/64$ | $T_{DCD}/64$ | $T_{REF}$ (26 MHz) | PFD Down ($T_{DCD}/64$-$T_{REF}$) |
|---|---|---|---|---|---|---|
| 1.4 GHz | Low | 1.7 GHz | 26.5625 MHz | 37.45 ns | 38.46 ns | 0.81 ns |
| | Center | 2.4 GHz | 37.5000 MHz | 26.67 ns | | 11.79 ns |
| | High | 3.1 GHz | 48.4375 MHz | 20.65 ns | | 17.81 ns |

As illustrated in Table 1, in the case where the DCO 102 has a tuning range of 1.4 GHz at the center frequency of 2.4 GHz, an output frequency becomes 1.7 GHz to 3.1 GHz, and accordingly a divided frequency $F_{DCO}/64$ becomes 26.5625 MHz to 48.4375 MHz. Since a down signal is output in a range of 0.81 ns to 17.82 ns as a result of comparison with $F_{REF}$ of 26 MHz depending on a tuning frequency of the DCO 102, the TDC 110 should measure a value of 0.81 ns to 17.82 ns. Therefore, the TDC of the digital PLL according to an embodiment of the present invention should have an input range of 20 ns or more with consideration of Process, Voltage, Temperature (PVT) variation.

Also, since the digital PLL according to an embodiment of the present invention level-scales a value of a digital code output depending on resolution of the TDC 110 and controls an output frequency of the DCO 102, the TDC 110 should have a high resolution performance corresponding to a channel interval of the PLL.

Table 2 illustrates a difference of $T_{DCD}/64$ depending on a channel interval.

TABLE 2

| Minimum Channel Spacing | | $F_{DCO}$ | $F_{DCO}/64$ | $T_{DCO}/64$ | Tdiff {Channel n − n + 1} |
|---|---|---|---|---|---|
| 1.4 MHz | Channel 1 | 2.4000 GHz | 37.5000 MHz | 26.6667 ns | — |
| | Channel 2 | 2.4014 GHz | 37.5219 MHz | 26.6511 ns | 15.55 ps |
| | Channel 3 | 2.4028 GHz | 37.5438 MHz | 26.6356 ns | 15.53 ps |
| | Channel 4 | 2.4042 GHz | 37.5656 MHz | 26.6201 ns | 15.51 ps |

For example, in the case where a minimum channel interval at an output frequency 2.4 GHz of a digital PLL is 1.4 MHz according to an LTE standard, a divided frequency $F_{DCO}/64$ provides a frequency difference of 21.9 kHz between channels, and when converted to a period, it becomes a time difference of about 15.5 ps. Therefore, the TDC 110 of the digital PLL according to an embodiment of the present invention should have resolution of 15.5 ps minimally for channel switching, and preferably has resolution of 1 ps with consideration of PVT conversion and a phase noise.

The TDC 110 requires a wide input range of 20 ns or more and a resolution performance of 1 ps in an operation region of 30 MHz. To support a wide input range, the TDC 110 may be configured in a three-step structure of a first-coarse TDC, a second-coarse TDC, and a fine TDC. For convenience in description hereinafter, the present invention refers to the first-coarse TDC as a first TDC, the second-coarse TDC as a second TDC, and the fine TDC as a third TDC. Also, to support resolution of 1 ps, a time-amplifier and a phase-interpolation may be used.

Figure 3:
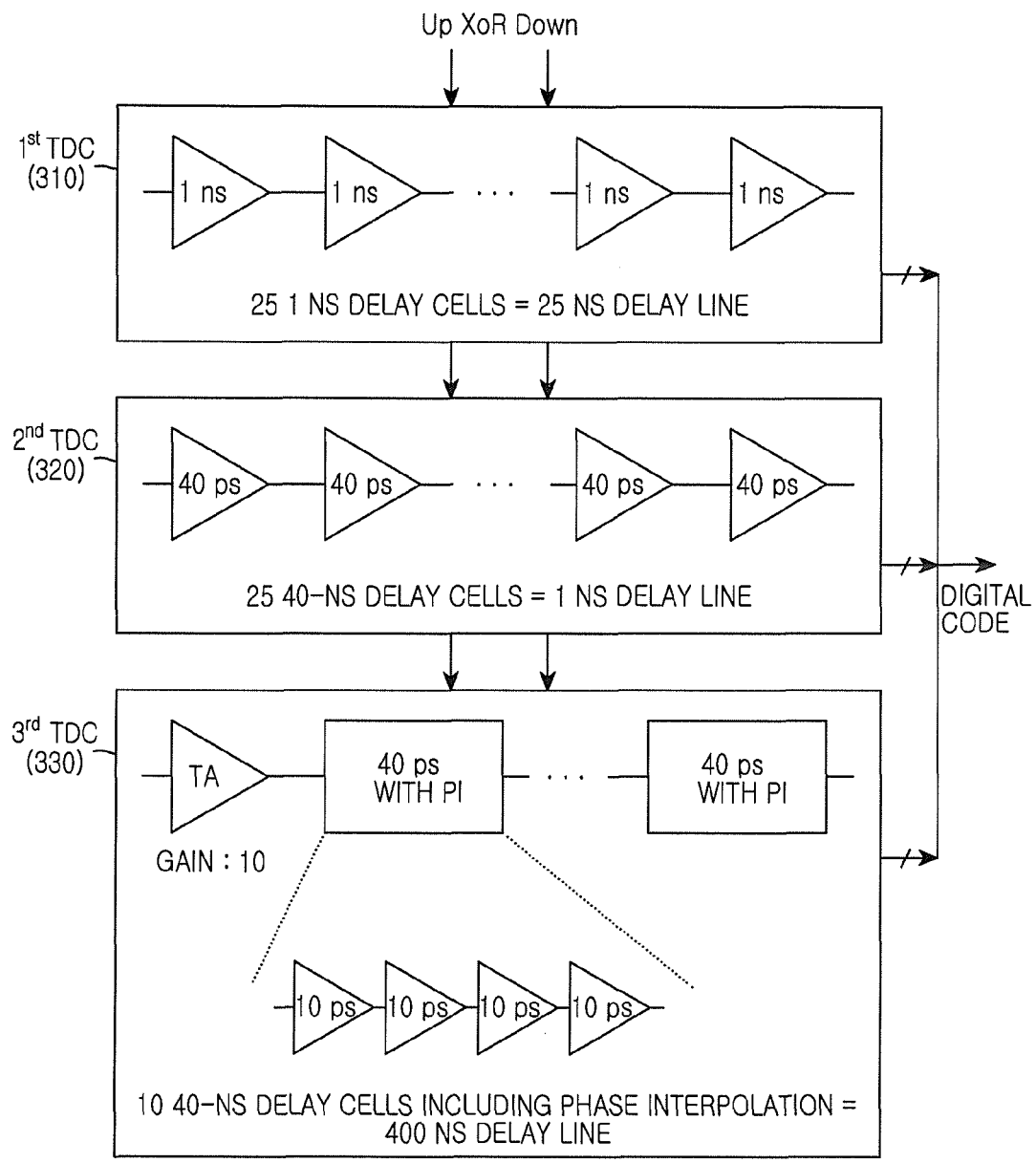
FIG. 3 is a conceptual view illustrating a Time to Digital Converter (TDC) of a digital PLL according to an embodiment of the present invention.

FIG. 3 conceptually illustrates a Time to Digital Converter (TDC) 110 of a digital PLL according to an embodiment of the present invention.

As illustrated in FIG. 3, the TDC 110 includes a first TDC 310, a second TDC 320, and a third TDC 330.

The first TDC 310 includes a delay line for delaying by 250 ns in total by having twenty five 1 ns-delay cells in order to provide a wide input range of 20 ns or more. For fine measurement inside 1 ns which is a minimum delay time unit of the first TDC 310, the second TDC 320 includes a delay line for delaying by 1 ns in total by having twenty five 40 ns-delay cells. For fine measurement inside 40 ns which is a minimum delay time unit of the second TDC, the third TDC 330 amplifies a delay time of 40 ps to a delay time of 400 ps via a time amplifier. Also, the third TDC 330 divides a phase of a delay cell of 40 ps using a phase-interpolation to provide a delay time function of 10 ps, and includes a delay line for delaying by 400 ps in total by having ten phase-interpolation circuits. For example, the phase interpolation circuit divides a delay of 40 ps into delays of 10 ps. Consequently, the TDC 110 provides a measurement resolution of a 1 ps unit equally dividing 40 ps by 40.

Figure 4:
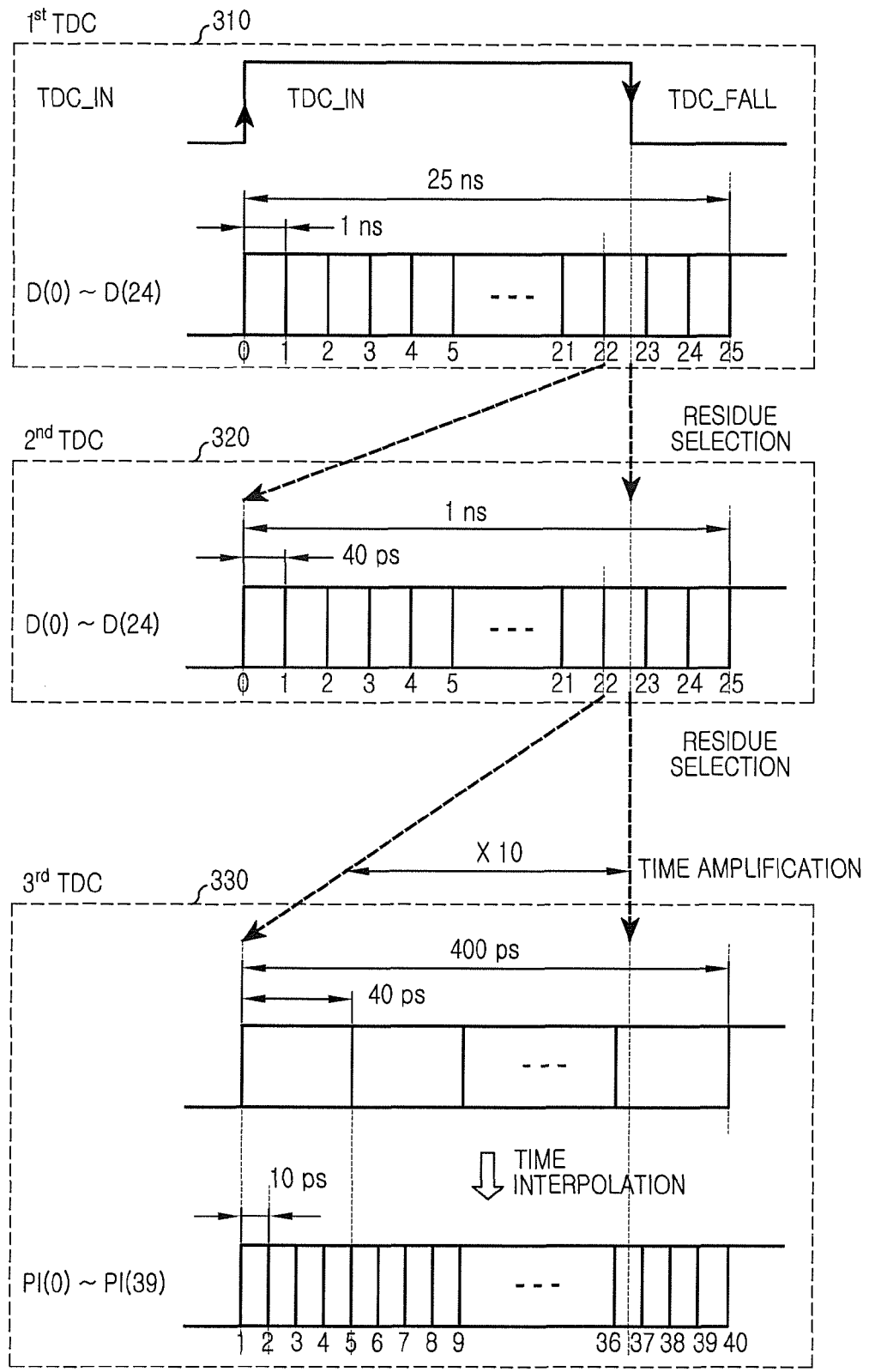
FIG. 4 is a conceptual view illustrating an operation of a TDC of a digital PLL according to an embodiment of the present invention.

FIG. 4 conceptually illustrates an operation of a TDC 110 of a digital PLL according to an embodiment of the present invention.

Referring to FIG. 4, the first TDC 310 measures a time length from TDC_Rise 401 to TDC_Fall 402 in a range of 25 ns at the maximum on a 1 ns basis. As illustrated in FIG. 4, the first TDC 310 measures that the time length is greater than 22 ns and equal to or less than 23 ns. Accordingly, the first TDC 310 provides a signal representing the point of 22 ns and a signal representing the point of TDC_Fall 402 to the second TDC 320.

The second TDC 320 measures a time length from the point of 22 ns to TDC_Fall 402 in a range of 1 ns at the maximum on a 40-ns basis. As illustrated in FIG. 4, the second TDC 320 measures that the time length is greater than 880 ps (=40 ps×22) and equal to or less than 920 ps (=40 ps×23). Accordingly, the second TDC 320 provides a signal representing the point of 22 ns+880 ps and a signal representing the point of TDC_Fall 402 to the third TDC 330.

The third TDC 330 measures a time length from the point of 22 ns+920 ps to TDC_Fall 402 in a range of 40 ps at the maximum on a 1 ps basis. However, a delay time of an inverter which is an element of a delay cell is limited by a process scale. Generally, since a minimum delay time of two inverters is 40 ps according to a process of 0.13 μm, two signals having an interval of 40 ps or less cannot be compared. Therefore, the third TDC 330 amplifies an interval between the two signals ten times via time amplification. Furthermore, to implement a smaller value than 40 ps which is a minimum time delay, the third TDC 330 provides a more subdivided measurement unit via phase-interpolation. As illustrated in FIG. 4, the third TDC 330 measures that the time length is greater than 36 ps and equal to or less than 37 ps.

As described above, it is measured by the first TDC 310, the second TDC 320, and the third TDC 330 that the time length from TDC_Rise 401 to TDC_Fall 402 is 22.916 ns (=22 ns+880 ps+36 ps).

Figure 5:
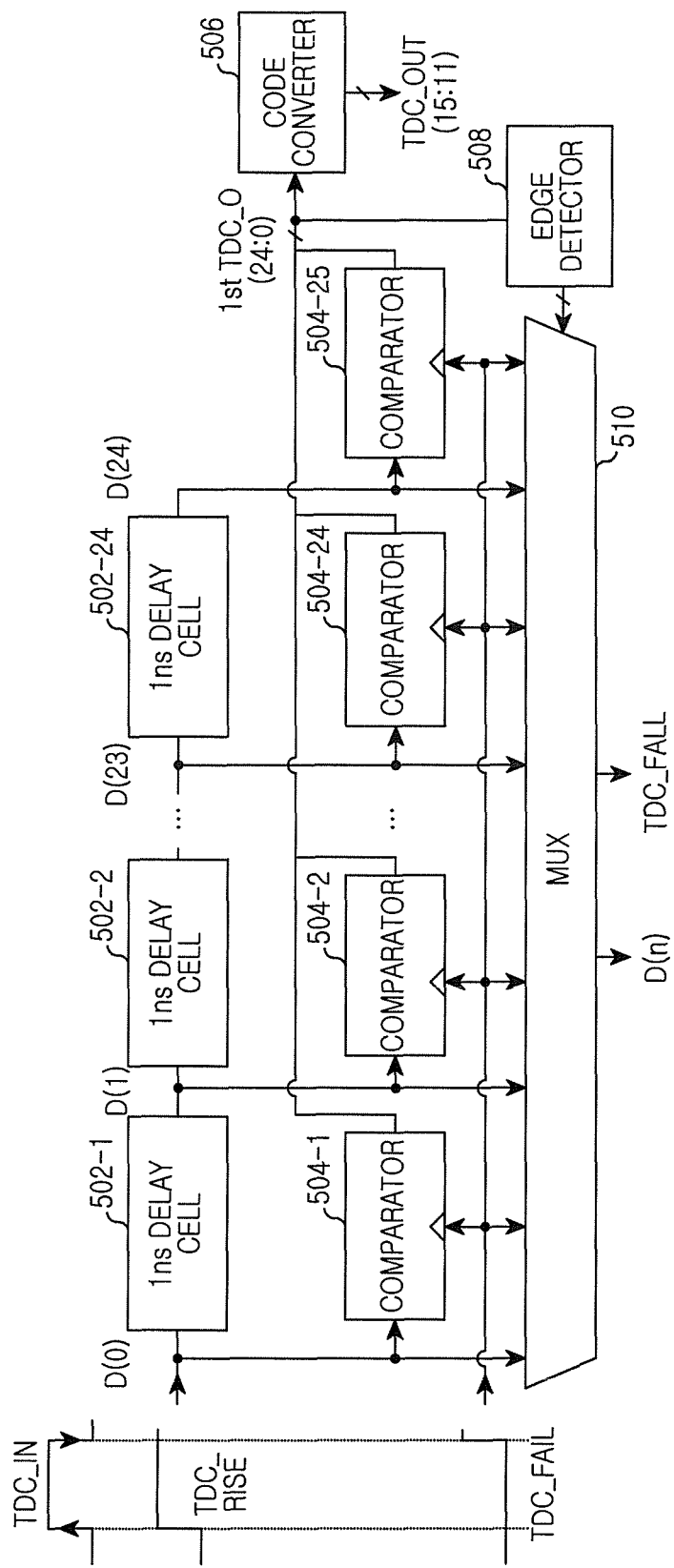
FIG. 5 is a block diagram illustrating a first TDC of a digital PLL according to an embodiment of the present invention.

FIG. 5 is a block diagram illustrating a first TDC 310 of a digital PLL according to an embodiment of the present invention.

As illustrated in FIG. 5, the first TDC 310 includes a plurality of 1-ns delay cells 502-1 to 502-24, a plurality of comparators 504-1 to 504-25, a code converter 506, an edge detector 508, and a Multiplexer (MUX) 510.

Input signals of the first TDC 310 are TDC_Rise and TDC_Fall. TDC_Rise is a signal representing a rising edge of a phase difference signal provided from the XOR operator 108, and TDC_Fall is a signal representing a falling edge of a phase difference signal provided from the XOR operator 108.

The plurality of 1-ns delay cells 502-1 to 502-24 are connected in series, and accumulatively delay a TDC_Rise signal by 1 ns. That is, a first delay cell 502-1 outputs a TDC_Rise signal delayed by 1 ns, and a second delay cell 502-2 outputs a TDC_Rise signal delayed by 2 ns. Accordingly, twenty five signals including the original TDC_Rise signal, that have experienced different time delays, respectively, are generated. For example, each of the plurality of 1-ns delay cells 502-1 to 502-24 may include at least one inverter. The original TDC_Rise signal and the signals delayed by the plurality of 1-ns delay cells 502-1 to 502-24, respectively, are input to the plurality of comparators 504-1 to 504-25, respectively.

The plurality of comparators 504-1 to 504-25 compare the original TDC_Rise signal and the signals delayed by the plurality of 1-ns delay cells 502-1 to 502-24, respectively, with TDC_Fall. When TDC_Rise is faster than TDC_Fall as a result of comparison, in other words, when TDC_Rise is 1 and TDC_Fall is 0, an output of the relevant comparator 504 is 1. In contrast, when TDC_Rise is equal to or later than TDC_Fall, in other words, when both TDC_Rise and TDC_Fall are 1, an output of the relevant comparator 504 is 0. Consequently, the plurality of comparators 504-1 to 504-25 generate a 25-bit code. For example, each of the plurality of comparators 504-1 to 504-25 may include at least one flip-flop. At this point, the first comparator 504-1, the second comparator 504-2, . . . sequentially output a value. Initially, a predetermined number of is occur and 0 occurs from a specific point of time. Depending on cases, only 0 may occur or only 1 may occur. Occurrence of only 0 denotes a time difference between TDC_Rise and TDC_Fall is 0 ns or less, and occurrence of only 1 denotes a time difference between TDC_Rise and TDC_Fall is greater than 25 ns. Occurrence of 0 from a specific point after a predetermined number of is occur denotes a time difference between TDC_Rise and TDC_Fall is equal to or greater than 0 ns and equal to or less than 25 ns. A portion at which 0 changes to 1 indicates the time difference.

The code converter 506 converts a 25-bit code generated by the plurality of comparators 504-1 to 504-25 to upper bits of a digital code which is TDC_OUT, that is, an output of the TDC 110. For example, the 25-bit code is converted to TDC_OUT[15:11]. However, though the code converter 506 has been illustrated as a portion of the first TDC 310 in FIG. 5, according to another embodiment of the present invention, the code converter 506 may be located outside the first TDC 310. The edge detector 508 detects a point at which TDC_Rise delayed closest to TDC_Fall has occurred by retrieving '10' from the 25-bit code generated by the plurality of comparators 504-1 to 504-25. In addition, the edge detector 508 controls the MUX 510 to output delayed TDC_Rise corresponding to the point '10' and TDC_Fall. The MUX 510 outputs D(n) which is delayed TDC_Rise corresponding to the point '10', and TDC_Fall to the second TDC 320 under control of the edge detector 508. Here, D(n) denotes delayed TDC_Rise input to the comparator 504 that has output a last '1'. At this point, an interval between two signals transferred to the second TDC 320 is 1 ns at the maximum.

Figure 6:
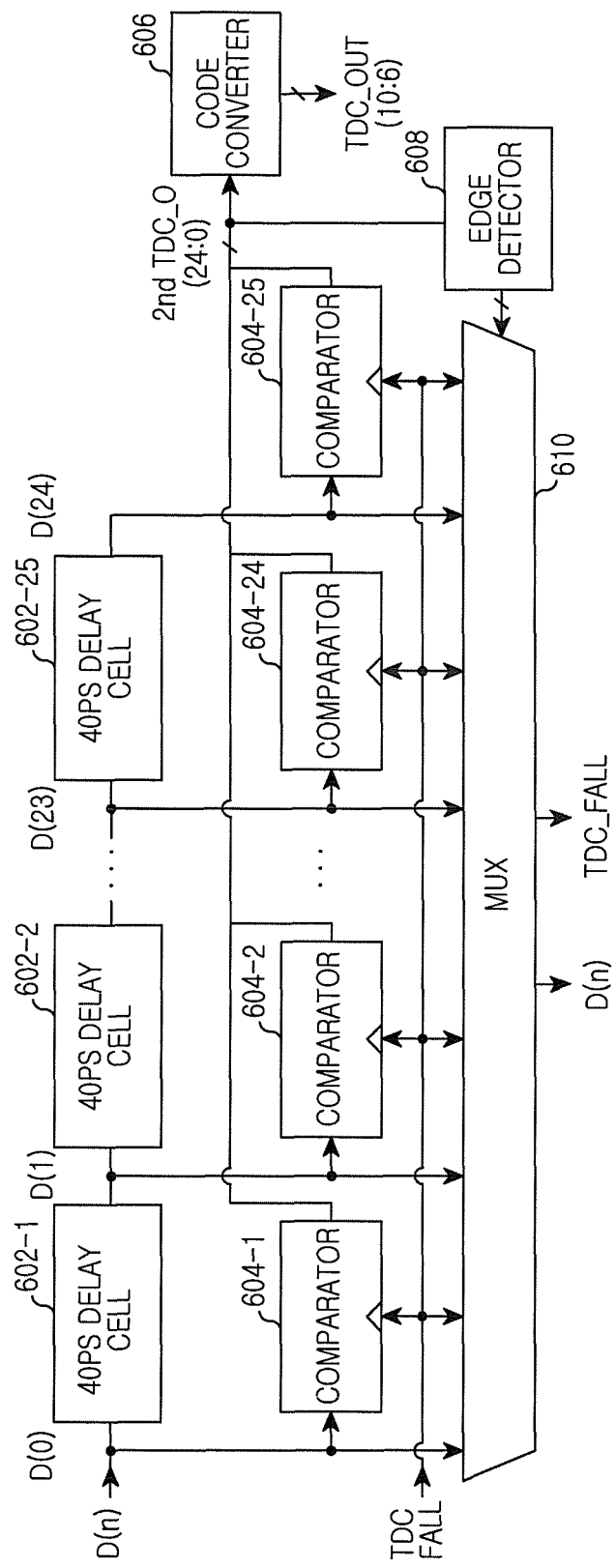
FIG. 6 is a block diagram illustrating a second TDC of a digital PLL according to an embodiment of the present invention.

FIG. 6 is a block diagram illustrating a second TDC 320 of a digital PLL according to an embodiment of the present invention.

As illustrated in FIG. 6, the second TDC 320 includes a plurality of 40 ps delay cells 602-1 to 602-24, a plurality of comparators 604-1 to 604-25, a code converter 606, an edge detector 608, and a MUX 610.

Input signals of the second TDC 320 are TDC_Rise delayed by the first TDC 310, that is, D(n) and TDC_Fall. TDC_Rise denotes a signal representing a rising edge of a phase difference signal provided from the XOR operator 108, and TDC_Fall denotes a signal representing a falling edge of a phase difference signal provided from the XOR operator 108.

The plurality of 40 ps delay cells 602-1 to 602-24 are connected in series, and accumulatively delay TDC_Rise by 40 ps. For example, a first delay cell 602-1 outputs a 40 ps-delayed TDC_Rise signal, and a second delay cell 602-2 outputs a 80 ps-delayed TDC_Rise signal. Accordingly, twenty five signals including the original TDC_Rise signal, that have experienced different time delays, respectively, are generated. The original TDC_Rise signal and the signals delayed by the plurality of 40-ps delay cells 602-1 to 602-24, respectively, are input to the plurality of comparators 604-1 to 604-25, respectively. For example, each of the plurality of 40-ps delay cells 602-1 to 602-24 may include at least one inverter.

The plurality of comparators 604-1 to 604-25 compare the original TDC_Rise signal and the signals delayed by the plurality of 40-ps delay cells 602-1 to 602-24, respectively, with TDC_Fall. When TDC_Rise is faster than TDC_Fall as a result of comparison, in other words, when TDC_Rise is 1 and TDC_Fall is 0, an output of the relevant comparator 604 is 1. In contrast, when TDC_Rise is equal to or later than TDC_Fall, in other words, when both TDC_Rise and TDC_Fall are 1, an output of the relevant comparator 604 is 0. Therefore, the plurality of comparators 604-1 to 604-25 generate a 25-bit code. At this point, the first comparator 604-1, the second comparator 604-2, . . . sequentially output a value. Initially, a predetermined number of 1s occur and 0 occurs from a specific point of time. Depending on cases, only 0 may occur or only 1 may occur. Occurrence of only 0 denotes a time difference between TDC_Rise and TDC_Fall is 0 ns or less, and occurrence of only 1 denotes a time difference between TDC_Rise and TDC_Fall is greater than 1 ns. Also, occurrence of 0 from a specific point after a predetermined number of 1 s occur initially denotes a time difference between TDC_Rise and TDC_Fall is equal to or greater than 0 ns and equal to or less than 1 ns. A portion at which 0 changes to 1 indicates the time difference. For example, each of the plurality of comparators 604-1 to 604-25 may include at least one flip-flop.

The code converter 606 converts a 25-bit code generated by the plurality of comparators 604-1 to 604-25 to some bits of a digital code which is TDC_OUT, that is, an output of the TDC 110. For example, the 25-bit code is converted to TDC_OUT [10:6]. However, though the code converter 606 has been illustrated as a portion of the second TDC 320 in FIG. 6, according to another embodiment of the present invention, the code converter 606 may be located outside the second TDC 320. The edge detector 608 detects a point at which TDC_Rise delayed closest to TDC_Fall has occurred by retrieving '10' from the 25-bit code generated by the plurality of comparators 604-1 to 604-25. In addition, the edge detector 608 controls the MUX 610 to output delayed TDC_Rise corresponding to the point '10' and TDC_Fall. The MUX 610 outputs D(n) corresponding to the point '10', and TDC_Fall to the third TDC 330 under control of the edge detector 608. Here, D(n) denotes delayed TDC_Rise input to the comparator 504 that has output a last '1'. At this point, an interval between two signals transferred to the second TDC 320 is 40 ns at the maximum.

Figure 7:
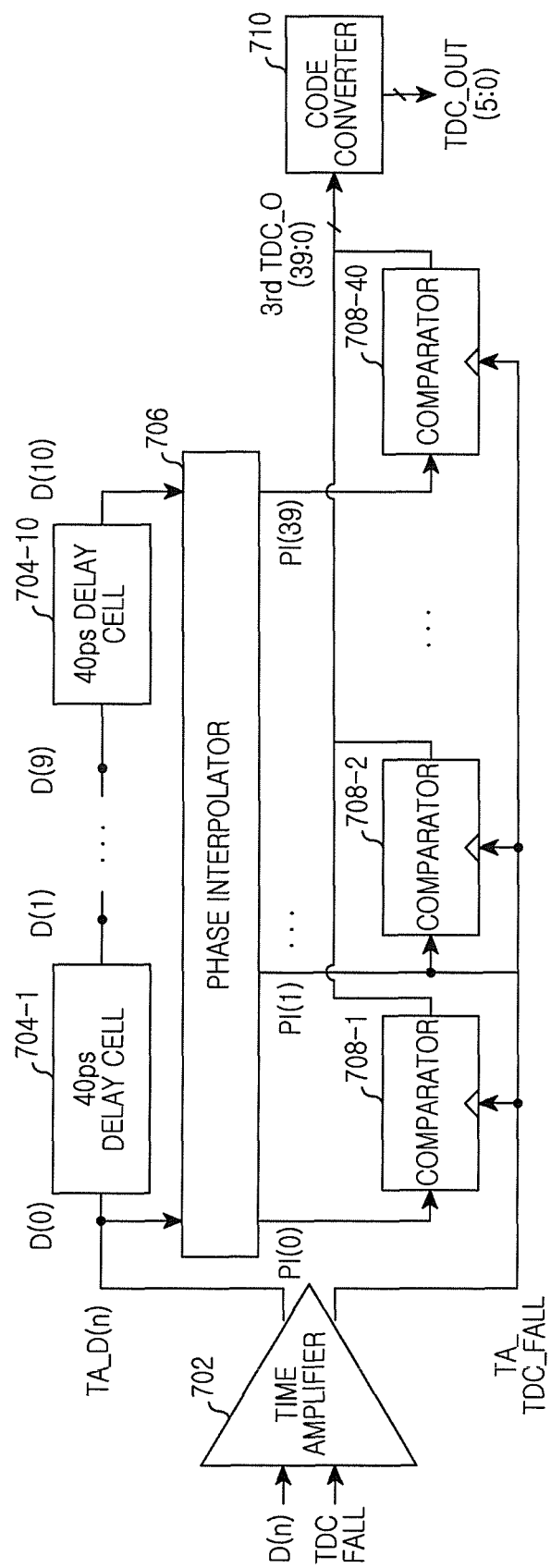
FIG. 7 is a block diagram illustrating a third TDC of a digital PLL according to an embodiment of the present invention.

FIG. 7 is a block diagram illustrating a third TDC 330 of a digital PLL according to an embodiment of the present invention.

As illustrated in FIG. 7, the third TDC 330 includes a time amplifier 702, a plurality of 40-ps delay cells 704-1 to 704-9, a phase interpolator 706, a plurality of comparators 708-1 to 708-40, and a code converter 710.

Input signals of the third TDC 330 are TDC_Rise delayed by the second TDC 320, that is, D(n) and TDC_Fall. At this point, a time difference between D(n) and TDC_Fall is 40 ps at the maximum.

The time amplifier 702 amplifies a time interval between two signals having a time interval of 40 ps at the maximum. For example, the time amplifier 702 has a gain of 10. In this case, the time interval between the two signals is amplified to 400 ps at the maximum. For example, the time amplifier 702 may include a plurality of latches. However, though the time amplifier 702 has been illustrated as a portion of the third TDC 330, according to another embodiment of the present invention, the time amplifier 702 may be located outside the third TDC 330.

The plurality of 40-ps delay cells 704-1 to 704-9 are connected in series, and accumulatively delay TDC_Rise by 40 ps. For example, a first delay cell 704-1 outputs a 40 ps-delayed TDC_Rise signal, and a second delay cell 704-2 outputs a 80 ps-delayed TDC_Rise signal. Accordingly, ten signals including the original TDC_Rise signal, that have experienced different time delays, respectively, are generated. The original TDC_Rise signal and the signals delayed by the plurality of 40-ps delay cells 704-1 to 704-9, respectively, are increased as forty signals having different delays by the phase interpolator 706, and are input to the plurality of comparators 708-1 to 708-40, respectively. For example, each of the plurality of 40-ps delay cells 704-1 to 704-9 may include at least one inverter.

The phase interpolator 706 implements a smaller delay than minimum delay times of the plurality of 40-ps delay cells 704-1 to 704-9 using the phase interpolation. For example, to implement the phase interpolation, four passive resistors may be connected in series between input nodes and output nodes of the plurality of 40-ps delay cells 704-1 to 704-9, respectively. Though the phase interpolator 706 has been illustrated as one block in FIG. 7, it may be configured in the form of a plurality of blocks corresponding to the plurality of 40-ps delay cells 704-1 to 704-9, respectively. A delayed signal of one delay cell is divided into N signals having different delays by the phase interpolator 706. For example, in the case where N is 4, a time delay function of 10 ps is implemented by the phase interpolator 706.

The plurality of comparators 708-1 to 708-40 compare the original TDC_Rise signal and the signals delayed by the plurality of 40-ps delay cells 704-1 to 704-9, respectively, with TDC_Fall. When TDC_Rise is faster than TDC_Fall as a result of comparison, in other words, when TDC_Rise is 1 and TDC_Fall is 0, an output of the relevant comparator 708 is 1. In contrast, when TDC_Rise is equal to or later than TDC_Fall, in other words, when both TDC_Rise and TDC_Fall are 1, an output of the relevant comparator 708 is 0. Therefore, the plurality of comparators 708-1 to 708-40 generate a 40-bit code. At this point, the first comparator 708-1, the second comparator 708-2, . . . sequentially output a value. Initially, a predetermined number of is occur and 0 occurs from a specific point of time. Depending on cases, only 0 may occur or only 1 may occur. Occurrence of only 0 denotes a time difference between TDC_Rise and TDC_Fall is 0 ps or less, and occurrence of only 1 denotes a time difference between TDC_Rise and TDC_Fall is greater than 40 ps. Also, occurrence of 0 from a specific point after a predetermined number of 1s initially occur denotes a time difference between TDC_Rise and TDC_Fall is equal to or greater than 0 ps and equal to or less than 40 ps. A portion at which 0 changes to 1 indicates the time difference. For example, each of the plurality of comparators 708-1 to 708-40 may include at least one flip-flop.

The code converter 710 converts a 40-bit code generated by the plurality of comparators 708-1 to 708-40 to lower bits of a digital code which is TDC_OUT, that is, an output of the TDC 110. For example, the 40-bit code is converted to TDC_OUT[5:0]. However, though the code converter 710 has been illustrated as a portion of the third TDC 330 in FIG. 7, according to another embodiment of the present invention, the code converter 710 may be located outside the third TDC 330.

In the detailed construction of the TDC 110 described with reference to FIGS. 5 to 7, the first TDC 310 includes 1-ns delay cells, the second TDC 320 includes 40-ps delay cells, and the third TDC 330 performs time amplification using a gain of 10, includes 40-ps delay cells, and performs 4-phase interpolation. However, according to another embodiment of the present invention, delay cells having values different from the values illustrated in FIGS. 5 to 7, a time amplifier having a gain of a different value, and a phase interpolator of a different value may be used.

Figure 8:
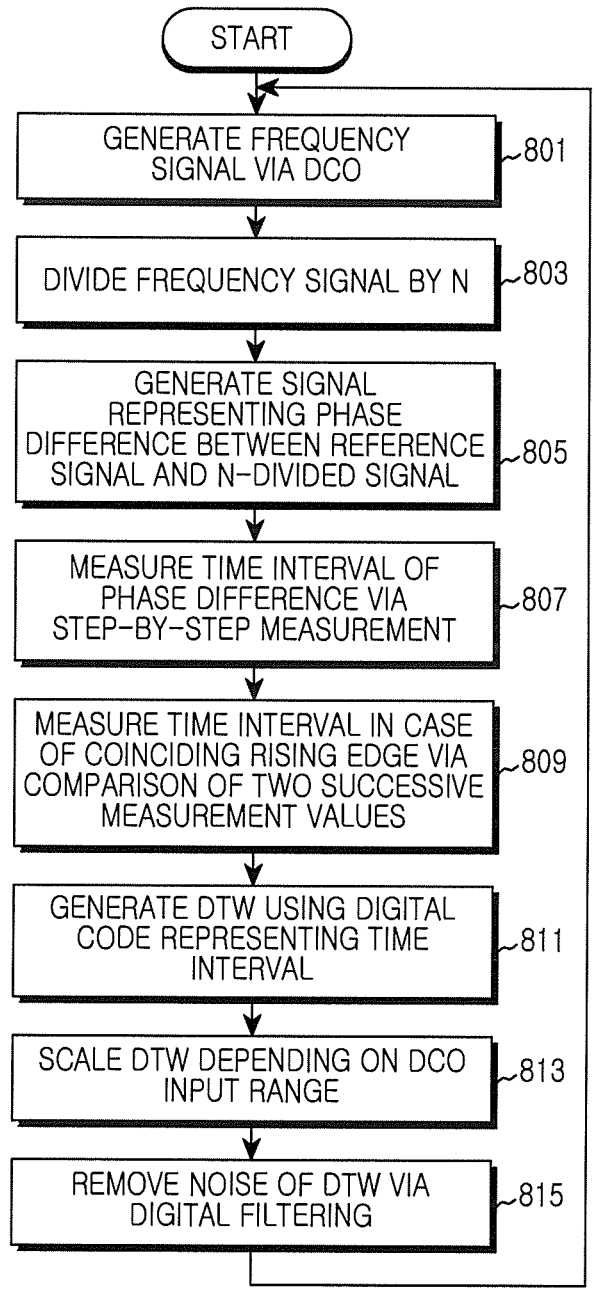
FIG. 8 is a flowchart illustrating a procedure for operating a digital PLL according to an embodiment of the present invention.

FIG. 8 illustrates a procedure for operating a digital PLL according to an embodiment of the present invention.

Referring to FIG. 8, the PLL generates a signal of a frequency corresponding to a digital tuning word by inputting the digital tuning word to a DCO in step 801. At this point, an MSB of the digital tuning word may be input as a DCO coarse tuning code, and a Least Significant Bits (LSB) may be input as a DCO fine tuning code. For example, a basic output frequency $F_{DCO}$ of the DCO may be 2.4 GHz. The basic output frequency may change depending on a characteristic and a standard of a system. For convenience in description, the present invention assumes that $F_{DCO}$ is 2.4 GHz.

Subsequently, the PLL proceeds to step 803 to divide a frequency signal output from the DCO at an integer ratio. For example, in the case where a basic output frequency $F_{DCO}$ of the DCO is 2.4 GHz and a dividing ratio is 64, the divider converts the frequency signal to 37.5 MHz (=$F_{DCO}$/64) by dividing $F_{DCO}$ of 2.4 GHz by 64.

After dividing the frequency signal, the PLL proceeds to step 805 to compare phases of the divided signal $F_{DCO}$/N and a reference signal $F_{REF}$, and generate a signal representing a phase difference. The signal representing the phase difference is an up signal or a down signal. At this point, the PFD for generating the up signal and the down signal generates a reset delay signal, which is a control signal for resetting the up signal and the down signal, and the reset delay signal is included in the up signal and the down signal. Therefore, the PLL may remove the reset delay signal by XOR-operating the up signal and the down signal.

After that, the PLL proceeds to step 807 to measure a time interval of the phase difference by performing measurement step by step. That is, the PLL converts the time interval of the phase difference to a digital code. At this point, the PLL uses time amplifying and phase interpolation for a wide input range and a high resolution output. A specific procedure of the step-by-step measurement of the time interval is described below with reference to FIG. 9.

After measuring the time interval, the PLL proceeds to step 809 to compare two successive measurement values and output a difference value of the comparison results. That is, to obtain a time interval value when rising edges coincide, the PLL calculates a difference between a k-th digital code and a (k−1)-th digital code.

Subsequently, the PLL proceeds to step 811 to generate a digital tuning word for operating the DCO using a CCW and a channel switching code in the time interval value. Specifically, the PLL subtracts two successive digital codes, and adds the CCW to the subtraction result. Also, the PLL adds a code for channel switching depending on channel selection information. In other words, the PLL generates a digital code for operating the DCO. At this point, when a channel does not change, addition of the channel switching code may be omitted.

Subsequently, the PLL proceeds to step 813 to scale the digital tuning word so that the digital tuning word is suitable for an input range of the DCO. In addition, the PLL proceeds to step 815 to reduce an error occur rate by removing a noise of the digital tuning word. After that, the PLL returns to step 801 to generate a signal of a frequency corresponding to a digital tuning word by inputting the digital tuning word to the DCO.

Figure 9:
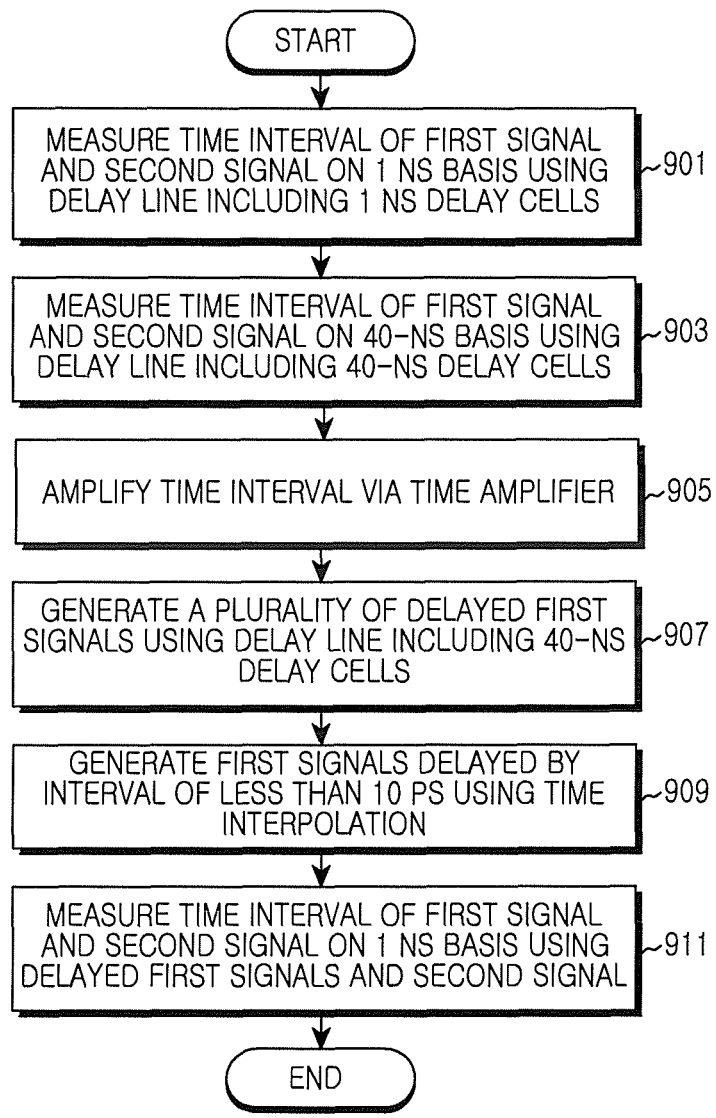
FIG. 9 is a flowchart illustrating a procedure for measuring a time interval of a digital PLL according to an embodiment of the present invention.

FIG. 9 illustrates a procedure for measuring a time interval of a digital PLL according to an embodiment of the present invention.

Referring to FIG. 9, the PLL measures a time interval between a first signal and a second signal on a 1 ns basis using a delay line including 1 ns delay cells in step 901. Here, the first signal denotes TDC_Rise representing a rising edge of a signal representing the phase difference, and the second signal denotes TDC_Fall representing a falling edge of a signal representing the phase difference. Specifically, the PLL generates first signals that have experienced different time delays using a plurality of 1 ns delay cells, and generates a code indicating a time interval by comparing each of the plurality of first signals with the second signal. Here, the code is converted to upper bits of a digital code which is a final measurement value. For example, the code may be 25 bits, and the code of 25 bits may be converted to TDC_OUT[15:11].

Subsequently, the PLL proceeds to step 903 to measure the time interval between the first signal delayed in step 901 and the second signal on a 40 ps basis using the delay line including 40 ps delay cells. Here, the first signal delayed in step 901 denotes a signal closest to the second signal among the first signals delayed on a 1 ns basis. That is, a maximum interval between the delayed first signal and the second signal compared in step 903 is 1 ns. Specifically, the PLL generates first signals that have experienced different time delays using a plurality of 40-ps delay cells, and generates a code indicating a time interval by comparing each of the plurality of first signals with the second signal. Here, the code is converted to some bits of a digital code which is a final measurement value. For example, the code may be 25 bits, and the code of 25 bits may be converted to TDC_OUT[10:6].

After that, the PLL proceeds to step 905 to amplify the time interval between the first signal delayed in step 903 and the second signal via a time amplifier. Here, the first signal delayed in step 903 denotes a signal closest to the second signal among the first signals delayed on a 40-ns basis. That is, a maximum interval between the delayed first signal and the second signal, amplified in step 905 is 40 ps. For example, the time amplifier may have a gain of 10. In this case, the time interval between the two signals is amplified to 400 ps at the maximum.

After amplifying the time interval, the PLL proceeds to step 907 to generate first signals delayed by an interval of 40 ps using a delay line including 40-ps delay cells. Signals that have experienced different time delays as much as the number of delay cells included in the delay line are generated.

Subsequently, the PLL proceeds to step 909 to generate first signals delayed by an interval of 10 ps using time interpolation. That is, the PLL divides each of the first signals delayed by an interval of 40 ps into four signals using the time interpolation. Accordingly, signals delayed by a smaller interval than a limit of a hardware are generated.

After that, the PLL proceeds to step 911 to measure a time interval between the first signal delayed in step 903 and the second signal on a 1 ps basis using the delayed first signals and the second signal. Here, the first signal delayed in step 903 denotes a signal closest to the second signal among the first signals delayed on a 1 ps basis. That is, a maximum interval between the delayed first signal and the second signal, amplified in step 905 is 40 ps. However, an actual maximum interval becomes 400 ps via the time amplification in step 905, and an actual delay interval via steps 907 and 909 is 10 ps, but a physical interval of 10 ps denotes an interval of 1 ps logically. Specifically, the PLL generates a code indicating a time interval by comparing each of the plurality of first signals delayed by an interval of 10 ps with the second signal. Here, the code is converted to some bits of a digital code which is a final measurement value. For example, the code may be 40 bits, and the code of 40 bits may be converted to TDC_OUT[5:0].

Figure 10:
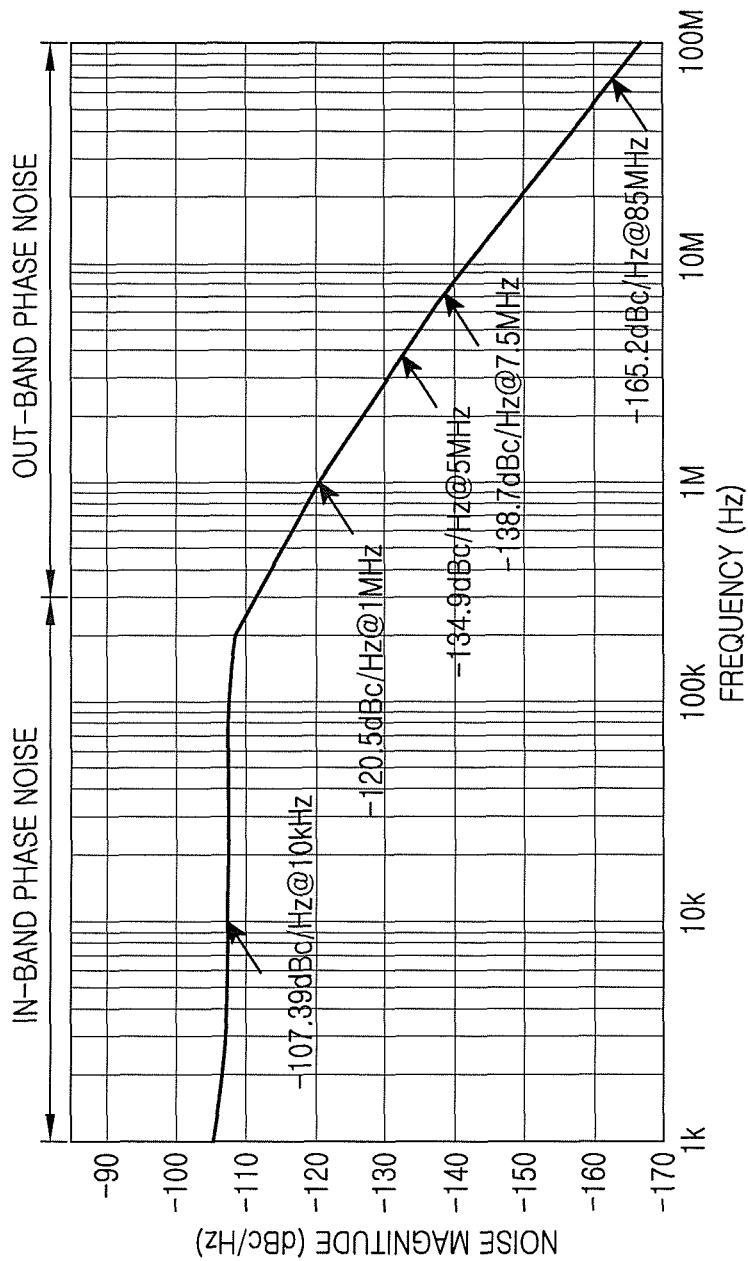
FIGS. 10 and 11 are views illustrating performance of a digital PLL according to an embodiment of the present invention.
Figure 11:
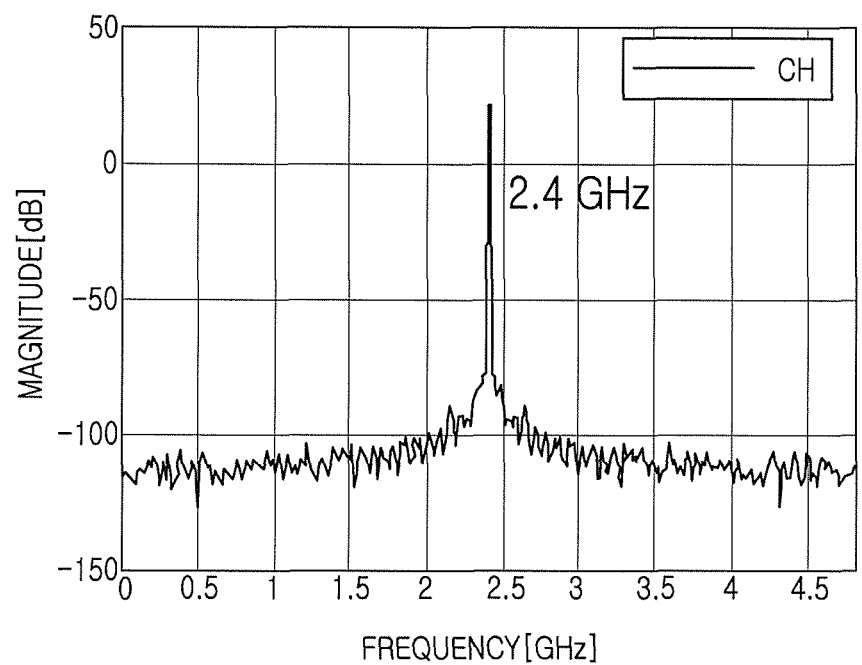

FIGS. 10 and 11 illustrate performance of a digital PLL according to an embodiment of the present invention. FIG. 10 is a graph illustrating a phase noise of a digital PLL according to an embodiment of the present invention, and FIG. 11 illustrates an output spectrum of a digital PLL according to an embodiment of the present invention. As illustrated in FIG. 10, in case of the digital PLL according to an embodiment of the present invention, an in-band phase noise shows about −107.39 dBc/Hz at 10 kHz. Also, as illustrated in FIG. 11, only one tone is output at 2.4 GHz.

Table 3 compares characteristics of the conventional PLLs and a digital PLL according to an embodiment of the present invention.

TABLE 3

|  | The Present Invention |  | Ref. [1] | Ref. [2] |
| --- | --- | --- | --- | --- |
| Process | 0.13 um CMOS |  | 90 nm CMOS | 90 nm CMOS |
| Frequency | 2.4 GHz |  | 2.4 GHz | 1.8 GHz |
| Power Consumption | 12 mW (@1.2 V) |  | 22 mW (@1.5 V) | 121 mW (@1 V, 1.7 V) |
| Area | DCO | 0.28 mm2 | 1.5 mm² | 2.25 mm² |
|  | TDC | 0.40 mm2 |  |  |
|  | Divider | 0.01 mm2 |  |  |
|  | PFD & Digital Block | 0.11 mm2 |  |  |
|  | Total | 0.80 mm2 |  |  |

In Table 3, Ref. [1] among PLLs compared as the conventional art is [Staszewski, R. B.; Balsara, P. T., "Phase-domain all-digital phase-locked loop", Circuits and Systems II: Express Briefs, IEEE Transactions on Volume 52, Issue 3, March 2005 Page(s): 159-163], Ref. [2] is [Minjae Lee; Heidari, M. E.; Abidi, A. A., "A Low-Noise Wideband Digital Phase-Locked Loop Based on a Coarse?Fine Time-to-Digital Converter With Subpicosecond Resolution", Solid-State Circuits, IEEE Journal of Volume 44, Issue 10, Oct. 2009 Page(s): 2808-2816].

As illustrated in Table 3, unlike the conventional analog PLL, the present invention simplifies a structure by using an integer divider, so that it is easy to design and an area and current consumption reduce. Also, a TDC operates in a low frequency band, so that an area and power consumption are minimized.

Although the invention has been shown and described with reference to certain exemplary embodiments thereof, it will be understood by those skilled in the art that various changes in form and details may be made therein without departing from the spirit and scope of the invention as defined by the appended claims and their equivalents. Therefore, the scope of the present invention should not be limited to the above-described embodiments but should be determined by not only the appended claims but also the equivalents thereof.

What is claimed is:

1. An apparatus of a digital Phase Locked Loop (PLL) in a wireless communication system, the apparatus comprising:
   a Digitally Controlled Oscillator (DCO) configured to generate a frequency signal based on an input Digital Tuning Word (DTW);
   a divider configured to divide the frequency signal at an integer ratio;
   a Phase Frequency Detector (PFD) configured to generate a signal representing a phase difference between a divided frequency signal and a reference signal;
   a Time to Digital Converter (TDC) configured to measure a time interval of the phase difference using the signal representing the phase difference;
   a delay comparator configured to calculate a time interval when rising edges coincide from values measured by the TDC; and
   a level scaler configured to generate a DTW that operates the DCO using a digital code representing the time interval.

2. The apparatus of claim 1, wherein the TDC is configured to measure the time interval step by step.

3. The apparatus of claim 1, wherein the TDC comprises:
   a first TDC comprising a plurality of delay cells configured to delay by a time 'a' and measure the time interval on the time 'a' basis; and
   a second TDC comprising a plurality of delay cells configured to delay by a time 'b' and measure the time interval on the time 'b' basis in a range of the time 'a',
   wherein 'a' is greater than 'b'.

4. The apparatus of claim 3, wherein the first TDC comprises:
   a plurality of delay cells configured to delay a first signal representing a rising edge of a signal representing the phase difference by the time interval 'a';
   a plurality of comparators configured to compare each of a plurality of first signals delayed by the time interval 'a' with a second signal representing a falling edge of the signal representing the phase difference, and generate a code representing a comparison result; and
   a detector configured to detect a point at which a first signal delayed closest to the second signal has occurred using the code.

5. The apparatus of claim 4, wherein the TDC comprises at least one code converter configured to convert the code generated by the plurality of comparators to some bits of the digital code representing a measurement value of the time interval.

6. The apparatus of claim 4, wherein the first TDC comprises a Multiplexer (MUX) configured to provide the first signal delayed closest to the second signal and the second signal to the second TDC.

7. The apparatus of claim 3, wherein the TDC comprises:
a time amplifier configured to amplify a time interval between a first signal representing a rising edge of the signal representing the phase difference and a second signal representing a falling edge of the signal representing the phase difference; and
a third TDC configured to measure the time interval in a range of the time 'b' using the amplified first signal and second signal.

8. The apparatus of claim 7, wherein the third TDC comprises:
a plurality of delay cells configured to delay the first signal by a time interval 'c';
a phase interpolator configured to divide each of first signals delayed by the time interval 'c' into M signals delayed by a time interval c/M via interpolation; and
a plurality of comparators configured to compare each of a plurality of first signals delayed by the time interval c/M with the second signal, and generate a code representing a comparison result.

9. The apparatus of claim 1, wherein the delay comparator is configured to subtract a k-th time interval measurement value from a (k+1)-th time interval measurement value.

10. The apparatus of claim 1, wherein the level scaler is configured to subtract two successive digital codes and adds a Channel Control Word (CCW) to a subtraction result.

11. The apparatus of claim 10, wherein the level scaler is configured to add the CCW and then add a code for channel switching depending on channel selection information.

12. The apparatus of claim 10, wherein the level scaler is configured to scale a digital tuning code such that the DTW is suitable for an input range of the DCO by multiplying the digital tuning code by a Level Scale Word (LSW).

13. The apparatus of claim 1, wherein the PFD is configured to compare phases of the divided frequency signal and the reference signal, and output an up signal and a down signal representing a difference of the phases, and
the up signal is a signal representing a relevant phase difference when the reference signal has a higher frequency than the divided frequency signal, and
the down signal is a signal representing a relevant phase difference when the reference signal has a lower frequency than the divided frequency signal.

14. The apparatus of claim 13, wherein the PFD is configured to generate a reset delay signal for resetting the up signal and the down signal, and wherein the up signal or the down signal comprises the reset delay signal.

15. The apparatus of claim 14, further comprising:
an XOR operator configured to perform an eXclusive OR (XOR)-operation on the up signal and the down signal in order to remove the reset delay signal from the up signal or the down signal.

16. An method of a digital Phase Locked Loop (PLL) in a wireless communication system, the method comprising:
generating, using a Digitally Controlled Oscillator (DCO), a frequency signal based on an input Digital Tuning Word (DTW);
dividing the frequency signal at an integer ratio;
generating, using a Phase Frequency Detector (PFD), a signal representing a phase difference between a divided frequency signal and a reference signal;
measuring, using a Time to Digital Converter (TDC), a time interval of the phase difference using the signal representing the phase difference;
calculating a time interval when rising edges coincide from values measured using the TDC; and
generating a DTW that operates the DCO using a digital code representing the time interval.

17. The method of claim 16, wherein the TDC measures the time interval step by step.

18. The method of claim 16, wherein measuring the time interval of the phase difference using the signal representing the phase difference comprises:
delaying by a time 'a' and measuring the time interval on the time 'a' basis; and
delaying by a time 'b' and measuring the time interval on the time 'b' basis in a range of the time 'a',
wherein 'a' is greater than 'b'.

19. The method of claim 18, wherein delaying by the time 'a' and measuring the time interval on the time 'a' basis comprises:
delaying a first signal representing a rising edge of a signal representing the phase difference by the time interval 'a';
comparing each of a plurality of first signals delayed by the time interval 'a' with a second signal representing a falling edge of the signal representing the phase difference;
generating a code representing a comparison result; and
detecting a point at which a first signal delayed closest to the second signal has occurred using the code.

20. The method of claim 19, wherein measuring the time interval of the phase difference using the signal representing the phase difference comprises converting the code generated representing the comparison result to some bits of the digital code representing a measurement value of the time interval.

* * * * *